(12) United States Patent
Milner et al.

(10) Patent No.: US 9,739,863 B2
(45) Date of Patent: Aug. 22, 2017

(54) SENSING DEVICE AND METHOD OF CALIBRATION

(71) Applicant: C.P. Electronics Limited, London, Greater London (GB)

(72) Inventors: Merlin Milner, Lewes (GB); Paul Mans, Harpenden (GB); Andrew Margetts-Kelly, Norwich (GB)

(73) Assignee: C.P. Electronics Limited, London (GB)

( * ) Notice: Subject to any disclaimer, the term of this patent is extended or adjusted under 35 U.S.C. 154(b) by 607 days.

(21) Appl. No.: 14/373,458

(22) PCT Filed: Jan. 21, 2013

(86) PCT No.: PCT/GB2013/050128
§ 371 (c)(1),
(2) Date: Jul. 21, 2014

(87) PCT Pub. No.: WO2013/108050
PCT Pub. Date: Jul. 25, 2013

(65) Prior Publication Data
US 2015/0002170 A1 Jan. 1, 2015

(30) Foreign Application Priority Data
Jan. 20, 2012 (GB) .................................. 1200997.3

(51) Int. Cl.
*G01S 13/56* (2006.01)
*G01S 7/02* (2006.01)
(Continued)

(52) U.S. Cl.
CPC ............ *G01R 35/005* (2013.01); *G01S 13/56* (2013.01); *G01S 17/50* (2013.01);
(Continued)

(58) Field of Classification Search
CPC .......... G01S 13/56; G01S 13/50; G01S 7/021; G01S 7/023; G01S 7/292–7/2922;
(Continued)

(56) References Cited

U.S. PATENT DOCUMENTS 5,325,096 A 6/1994 Pakett
5,612,674 A * 3/1997 Tice ....................... G08B 29/26
340/501
(Continued)

FOREIGN PATENT DOCUMENTS

CN 201322801 10/2009
CN 102 135 241 A 7/2011
(Continued)

OTHER PUBLICATIONS

International Search Report with Written Opinion for corresponding patent application No. PCT/GB2013/050128 dated Jun. 12, 2013.
(Continued)

*Primary Examiner* — Peter Bythrow
(74) *Attorney, Agent, or Firm* — Renner, Otto, Boisselle & Sklar, LLP

(57) ABSTRACT

A sensing device comprises a microwave sensor (1) configured to emit microwave radiation and to receive microwave radiation reflected by a moving body in the field of detection of the microwave sensor and a wireless data transmitter (4) configured to transmit data to a remote receiver. A main power supply provides electrical power at a first voltage to the sensing device. A first regulator 6 provided between the main power supply and the microwave sensor (1) provides a sensor power supply to the microwave sensor (1) at a voltage below the voltage of the main power supply. The wireless data transmitter (4) is powered from the main power supply via a transmitter power supply connection arranged in parallel with the first regulator (6). The micro-
(Continued)

wave sensor (1) is provided on a first circuit board and the wireless data transmitter (4) is provided on a second circuit board, with the second circuit board overlying the first circuit board and spaced therefrom. A signal processing device is configured to receive an output signal from the microwave sensor and to generate an occupancy signal indicative of the presence of a moving body in the field of detection of the microwave sensor (1) when the output signal of the microwave (1) sensor (1) exceeds a threshold level. The signal processing device is configured to increase the threshold level temporarily during data transmission by the wireless data transmitter (4), in order to compensate for RF interference due to the data transmission.

21 Claims, 3 Drawing Sheets

(51) Int. Cl.

| | | |
|---|---|---|
| *G01S 7/292* | (2006.01) | |
| *G08B 13/24* | (2006.01) | |
| *G01R 35/00* | (2006.01) | |
| *G08B 29/18* | (2006.01) | |
| *G08B 29/26* | (2006.01) | |
| *H05B 37/02* | (2006.01) | |
| *G01S 17/50* | (2006.01) | |
| *G01S 7/36* | (2006.01) | |
| *G01S 7/00* | (2006.01) | |

(52) U.S. Cl.
CPC ......... *G08B 13/2491* (2013.01); *G08B 29/18* (2013.01); *G08B 29/26* (2013.01); *H05B 37/0227* (2013.01); *G01S 7/003* (2013.01); *G01S 7/021* (2013.01); *G01S 7/023* (2013.01); *G01S 7/292* (2013.01); *G01S 7/36* (2013.01)

(58) Field of Classification Search
CPC .................. G01S 7/36; H04J 7/00; G08B 13/2491–13/2497; G08B 29/26
See application file for complete search history.

(56) References Cited

U.S. PATENT DOCUMENTS

| | | | | |
|---|---|---|---|---|
| 5,684,458 A * | 11/1997 | Calvarese | ........... | G08B 29/183 340/552 |
| 5,920,259 A | 7/1999 | Shpater | | |
| 6,069,561 A | 5/2000 | Schöpf et al. | | |
| 6,127,926 A * | 10/2000 | Dando | ............... | G08B 13/2491 340/522 |
| 6,456,231 B1 | 9/2002 | McEwan | | |
| 7,123,145 B2 * | 10/2006 | Reilly | ..................... | G01S 13/56 340/541 |
| 7,155,230 B2 * | 12/2006 | Tsien | ...................... | G01S 7/021 455/226.2 |
| 7,522,669 B2 * | 4/2009 | Husted | ................. | H03G 3/3068 375/252 |
| 7,702,044 B2 * | 4/2010 | Nallapureddy | ......... | G01S 7/023 342/13 |
| 7,702,291 B2 * | 4/2010 | Hansen | ................... | G01S 7/021 342/17 |
| 8,284,095 B2 * | 10/2012 | Matsue | .................... | G01S 7/021 342/20 |
| 8,674,823 B1 * | 3/2014 | Contario | ................... | H02J 1/10 340/333 |
| 9,247,215 B1 * | 1/2016 | Athan | ...................... | G01C 3/06 |
| 9,557,413 B2 * | 1/2017 | Kozma | .................. | G01S 13/522 |
| 2002/0003488 A1 * | 1/2002 | Levin | ...................... | G01S 7/023 342/70 |
| 2003/0058133 A1 * | 3/2003 | Arnold | .................... | G01S 13/04 340/933 |
| 2005/0059364 A1 * | 3/2005 | Hansen | ................... | G01S 7/021 455/127.4 |
| 2006/0033642 A1 | 2/2006 | Calderone et al. | | |
| 2007/0001835 A1 * | 1/2007 | Ward | .................. | G07C 9/00111 340/522 |
| 2007/0247352 A1 * | 10/2007 | Michael | .................. | G01S 13/34 342/128 |
| 2008/0001809 A1 * | 1/2008 | Woodington | ........... | G01S 7/023 342/70 |
| 2009/0121870 A1 * | 5/2009 | Green | .................... | G08B 29/26 340/554 |
| 2010/0109934 A1 | 5/2010 | Drake | | |
| 2011/0273323 A1 | 11/2011 | Bays et al. | | |
| 2011/0309969 A1 * | 12/2011 | Gravelle | ............... | G01S 13/751 342/130 |
| 2012/0127021 A1 * | 5/2012 | Gravelle | ................ | G01S 7/023 342/130 |
| 2013/0005280 A1 * | 1/2013 | Leung | .................... | G01S 7/023 455/90.1 |
| 2013/0057428 A1 * | 3/2013 | Himmelstoss | .......... | G01S 7/023 342/175 |

FOREIGN PATENT DOCUMENTS

| | | |
|---|---|---|
| DE | 10 2005 042568 B3 | 1/2007 |
| EP | 1435007 A1 | 6/2003 |
| EP | 1752946 A1 | 8/2005 |
| GB | 2408864 A | 6/2005 |
| GB | 2419056 A | 4/2006 |
| JP | 2004235244 A | 8/2004 |

OTHER PUBLICATIONS

Office Action for corresponding Application No. GB1200997.3 dated May 8, 2012.
Search Report for corresponding Application No. GB1200997.3, claims 11-15 and 17-21, dated Jun. 5, 2013.
Search Report for corresponding Application No. GB1200997.3, claims 16-21, dated Jun. 5, 2013.
Lin Gu et al.; "Lightweight Detection and Classification for Wireless Sensor Networks in Realistic Environments", ACM, 2005, abstract.

\* cited by examiner

SENSING DEVICE AND METHOD OF CALIBRATION

This application is a national phase of International Application No. PCT/GB2013/050128 filed Jan. 21, 2013 and published in the English language.

This invention relates to a sensing device and a method of calibrating the same.

BACKGROUND

Occupancy sensors are used in a variety of applications to detect the presence of people and variously turn on lights, ventilation equipment etc. It is known to link the detectors together with other equipment in a network to allow communication of information between sensors and, for example, output devices. Furthermore, there exist networks which allow sensors to communicate wirelessly.

There are three main types of occupancy sensor on the market: PIR (passive infrared) which rely on body heat to detect occupancy; ultrasonic sensors measure reflected ultrasound; and microwave sensors which use reflected radio waves and detect Doppler shifts caused by moving targets.

There are some specific problems associated with combining microwave occupancy sensors and wireless data transceivers in the same product. The microwave occupancy sensor consists of a transmitter, a receiver and a mixer. The transmitter emits radiation at a given frequency. A high sensitivity receiver receives the signal reflected from the targets and mixes it with the outgoing signal to generate an IF (intermediate frequency) output which is analysed for Doppler shift. The microwave sensor's receiver is very sensitive, capable of detecting very small amounts of in-band energy, i.e. close to the operating frequency. Due to its high sensitivity the microwave receiver is susceptible to interference from powerful out-of-band signals. Even though the wireless data transmitter does not operate at the same frequency as the microwave detector, interference arises where a small part of the powerful data transmitter's signal is admitted to the circuitry of the microwave detector. Further, the microwave receiver is also very sensitive to power supply fluctuations within the circuit, which occur when wireless data is transmitted.

This invention, at least in its preferred embodiments, seeks to provide a method for combining wireless data transmission and microwave occupancy sensing in the same product, overcoming the various sources of false triggers.

BRIEF SUMMARY OF THE DISCLOSURE

Viewed from a first aspect, the present invention provides a sensing device comprising a microwave sensor configured to emit microwave radiation and to receive microwave radiation reflected by a moving body in the field of detection of the microwave sensor and a wireless (radio frequency) data transmitter configured to transmit data to a remote receiver. The device further comprises a main power supply for providing electrical power at a first voltage to the sensing device and a first regulator provided between the main power supply and the microwave sensor for providing a sensor power supply to the microwave sensor at a voltage below the voltage of the main power supply, wherein the wireless data transmitter is powered from the main power supply via a transmitter power supply connection arranged in parallel with the first regulator.

Thus, according to the invention, when the wireless data transmitter operates and draws current from the main power supply, the voltage of the sensor power supply is unaffected because any drop in the voltage of the main power supply does not reach the voltage level of the regulated sensor power supply.

The wireless data transmitter may be powered directly from the main power supply. Typically, however, the sensing device further comprises a second regulator provided between the main power supply and the wireless data transmitter in parallel with the first regulator for providing a transmitter power supply to the wireless data transmitter at a voltage below the voltage of the main power supply.

A first inductor may be provided between the transmitter power supply connection and the first regulator. A second inductor may be provided in the transmitter power supply connection to the wireless data transmitter. A third inductor may be provided in the return path of the sensor power supply. A fourth inductor may be provided in the return path of the transmitter power supply in parallel with the return path of the sensor power supply. The inductors prevent RF coupling between the microwave sensor and the wireless data transmitter. The inductors may be ferrites.

The voltage of the main power supply is typically in the range 10V to 18V, for example 12V. The voltage of the sensor power supply is typically in the range 1V to 7V, for example 5V. The voltage of the transmitter power supply is typically in the range 1V to 7V, for example 3.3V.

In embodiments of the invention the wireless data transmitter may be a wireless data transceiver.

The microwave sensor may be provided on a first circuit board and the wireless data transmitter may be provided on a second circuit board. The second circuit board may overlie the first circuit board and be spaced therefrom. The spacing between the first and second circuit boards may be an air gap. Providing the sensor and the data transmitter on separate circuit boards further reduces electromagnetic coupling between the sensor and the data transmitter.

This in itself is believed to be novel and thus viewed from a further aspect the invention provides a sensing device comprising a microwave sensor configured to emit microwave radiation and to receive microwave radiation reflected by a moving body in the field of the detection of the microwave sensor and a wireless data transmitter configured to transmit data to a remote receiver, wherein the microwave sensor is provided on a first circuit board and the wireless data transmitter is provided on a second circuit board, with the second circuit board overlying the first circuit board and spaced therefrom.

The electrical connections between the first circuit board and the second circuit board may comprise one or more inductors, e.g. ferrites, for suppressing radio frequency interference of the microwave sensor by the wireless data transmitter.

The second circuit board may comprise an antenna for the wireless data transmitter. The second circuit board may form a ground plane for the antenna. Thus the second circuit board may be provided with a conductive layer over the majority of one surface thereof.

Typically, the antenna is provided on a portion of the second circuit board that is substantially perpendicular to the plane of the first circuit board.

A layer of radar absorptive material (RAM) may be interposed between the first circuit board and the second circuit board. The RAM further reduces electromagnetic coupling between the sensor and the transmitter.

The sensing device may comprise a signal processing device configured to receive an output signal from the microwave sensor and to generate an occupancy signal indicative of the presence of a moving body in the field of detection of the microwave sensor when the output signal exceeds a threshold level, wherein the signal processing device is configured to increase the threshold level temporarily during data transmission by the wireless data transmitter, whereby to compensate for RF interference due to the data transmission.

This in itself is believed to be novel and thus viewed from a yet further aspect the invention provides a sensing device comprising a microwave sensor configured to emit microwave radiation and to receive microwave radiation reflected by a moving body in the field of the detection of the microwave sensor, a wireless data transmitter configured to transmit data to a remote receiver, and a signal processing device configured to receive an output signal from the microwave sensor and to generate an occupancy signal indicative of the presence of a moving body in the field of detection of the microwave sensor when the output signal exceeds a threshold level, wherein the signal processing device is configured to increase the threshold level temporarily during data transmission by the wireless data transmitter, whereby to compensate for RF interference due to the data transmission.

The output signal of the microwave sensor is typically amplified before it is received by the signal processing device. The occupancy signal may be generated when the output signal exceeds a threshold level instantaneously. More typically, the occupancy signal may be generated when the output signal exceeds a threshold level for a predetermined period of time. The occupancy signal may be generated when the average output signal over a predetermined time period exceeds a threshold level.

The threshold may be increased by increasing a threshold value or by subtracting the same amount from the output signal value. Both options are within the scope of the invention.

A method of calibrating the sensing device comprises:
determining that the output signal from the microwave sensor has been at a low level indicative of the absence of a moving body in the field of detection of the microwave sensor for a period of time;
transmitting data using the wireless data transmitter;
during data transmission measuring the output signal from the microwave sensor;
determining on the basis of the measured output signal an amount by which the threshold level shall be increased temporarily during data transmission to compensate for RF interference due to the data transmission.

The method may comprise the subsequent steps of:
waiting for a predetermined period of time and repeating the method;
comparing the first threshold increase amount determined to the second threshold increase amount determined, whereby to confirm that the determined threshold amounts are representative of RF interference due to the data transmission.

The method may comprise the subsequent step of determining that the output signal from the microwave sensor has continued for a period of time at a low level indicative of the absence of a moving body in the field of detection of the microwave sensor.

The invention extends to a sensing device comprising a data processing device configured to control the sensing device to carry out the calibration method. The signal processing device may be provided by the data processing device.

BRIEF DESCRIPTION OF THE DRAWINGS

Embodiments of the invention are further described hereinafter with reference to the accompanying drawings, in which.

DETAILED DESCRIPTION

There are three main paths which cause the wireless transmission of data to disturb the microwave occupancy detector: power supply dips; conducted coupling of RF noise; radiated coupling of RF noise. These are addressed below.

Figure 1:
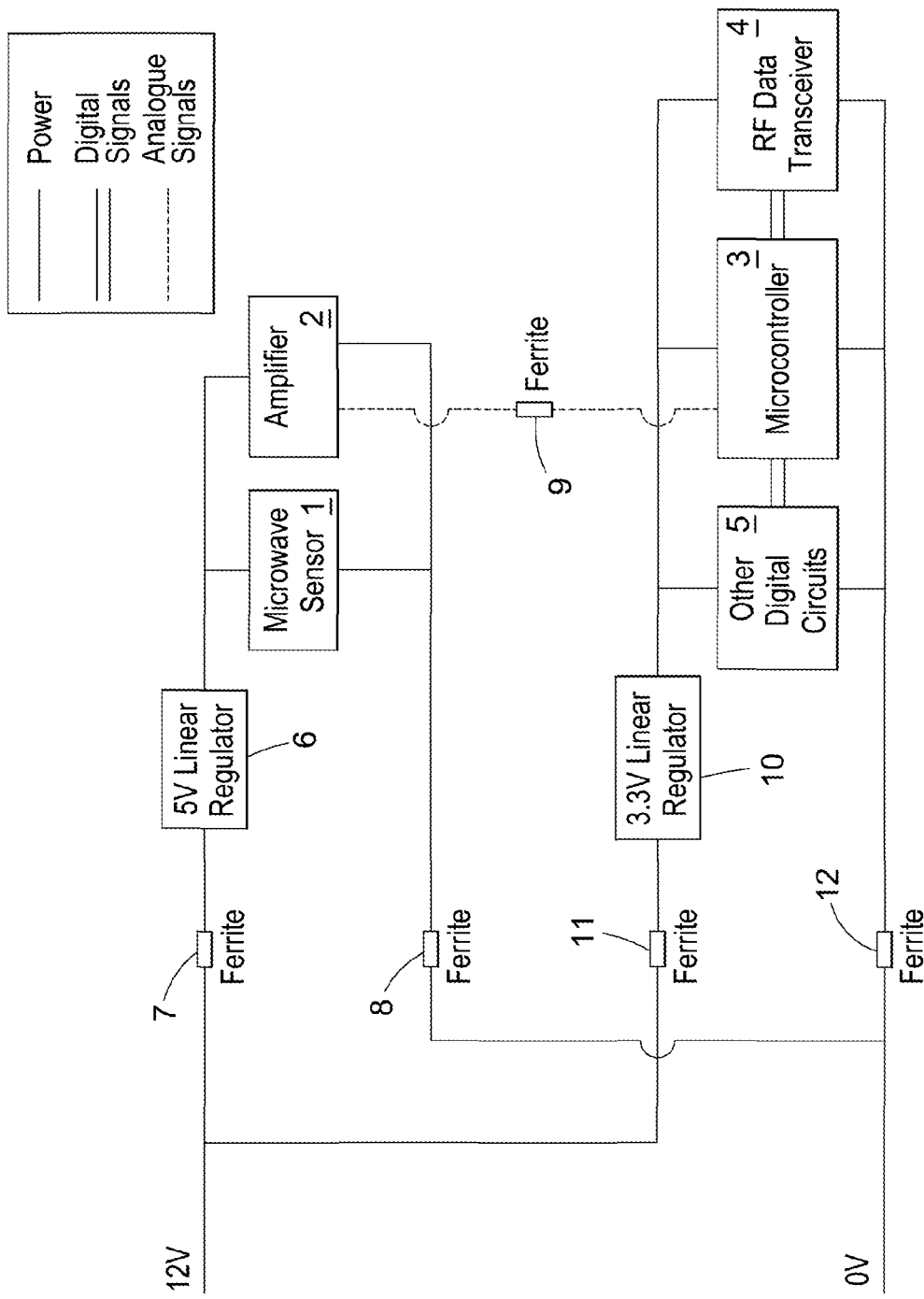
FIG. 1 is a schematic circuit diagram of a sensing device according to an embodiment of the invention.

FIG. 1 shows schematically the configuration of a sensing device according to an embodiment of the present invention. The sensing device comprises a microwave sensor 1 which is configured to emit microwave radiation and to receive reflected microwave radiation in order to detect moving bodies within the detection field of the sensor. The output of the microwave sensor 1 is an analogue signal (indicated by a dashed line in FIG. 1), which is amplified by an analogue amplifier 2 and passed to a microcontroller 3 for signal processing. The microcontroller 3 is in data communication with a wireless data transceiver 4, which is configured to communicate information relating to the output of the microwave sensor 1 with a remote lighting controller or other components of a lighting system and to receive dimming commands from the remote lighting controller. The digital signal paths in FIG. 1 are indicated by double lines. The microcontroller 3 is also in data communication with other digital circuits 5, such as an infra-red transceiver which acts as a programming interface for the microcontroller 3, as well as signal processing circuits and light emitting diodes (LEDs).

As shown in FIG. 1, the sensing device is powered by a 12 volt supply, provided by a rectified mains voltage dropped down to an secondary voltage of 12V. The 12 volt supply is used to power an output block comprising a relay and a dimming circuit (not shown). The 12V supply is split to provide respective power supplies to the analogue components (microwave sensor 1 and amplifier 2) and the digital components (microcontroller 3, data transceiver 4, etc.). A 5 volt linear regulator 6 provides the 5 volt power supply to the microwave sensor 1 and amplifier 2. The power supply lines to the analogue components are isolated from high frequencies on the main power supply by ferrites 7, 8 at the input to the 5V linear regulator and the connection to the 0V rail, respectively. A further ferrite inductor 9 is provided between the analogue amplifier 2 and the microcontroller 3 to prevent perturbation via this analogue signal path.

Similarly, a 3.3 volt linear regulator 10 provides the power supply to the digital components. The 3.3V power supply lines to the digital components are isolated from the main power supply at high frequencies by ferrites 11, 12 at the input to the 3.3V linear regulator 10 and the connection to the 0V rail, respectively. This acts to limit the extent to which RF frequency noise and coupled RF signals propagate, in order to terminate the sources of perturbation locally.

The configuration of the sensing device shown in FIG. 1 addresses the issue of power supply dips, which can be caused by the wireless transmission of data, which in turn disturbs the microwave occupancy detector 1. Each time the wireless transceiver 4 sends or receives a packet of data, a spike in current demand occurs. As the power supply has a relatively high impedance output, and the capacitance required to handle the surge is too high to realistically build such capacitance in, this causes a small and short term dip in the power supply voltage. If the wireless transceiver 4 and the microwave sensor 1 were powered by a common supply, the highly sensitive RF receiver of the microwave sensor 1 would measure this voltage drop, which would be amplified by the analogue amplifier 2 and would be falsely identified as a trigger indicative of a moving object in the detection field of the microwave sensor 1. From the 12v supply rail there would normally be a single regulator to power the microwave sensor 1, wireless data transceiver 4 and microprocessor circuits. However, in the configuration of FIG. 1, there are two regulators 6, 10, one for the sensitive analogue amplifier 2 and microwave sensor 1, and a second regulator 10 for the microcontroller and high current parts, such as the LEDs and the wireless transceiver 4. This is an effective method for isolating the wireless sensor 1 from the rest of the circuitry and providing it with a clean and stable power supply. If there is a current spike from the wireless transceiver 4 this will cause a voltage drop at the 12V rail, but because the 12V supply is substantially higher than the required voltage for the sensor regulator 6, the voltage drop is not experienced by the microwave sensor 1 and no false triggering occurs.

In addition to the individual regulation of supplies both regulators 6, 10 are isolated from each other at RF frequencies by using carefully selected ferrites 7, 8, 11, 12 on the power supply rails to the regulators 6, 10 and on their return paths. These ferrites aid the mitigation of what would have otherwise been a low impedance path for the RF energy to travel down from the data transceiver 4 to the microwave sensor 1.

Figure 2:
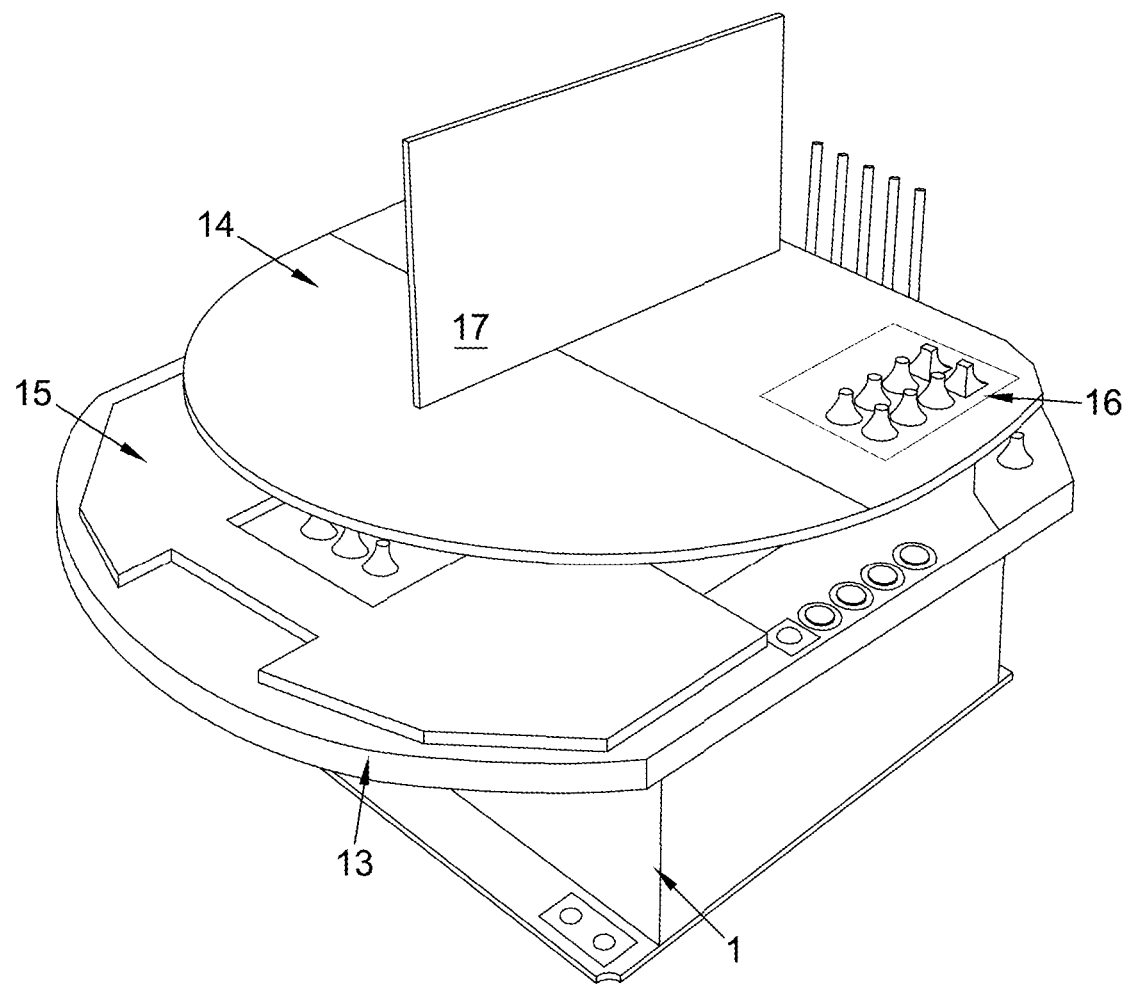
FIG. 2 shows the configuration of the circuit boards of the device of FIG. 1.

FIG. 2 shows the physical arrangement of the components of the sensing device. As shown in FIG. 2, the microwave sensor 1 is provided on a main printed circuit board 13, together with additional components of the device, such as the microcontroller 3.

The wireless data transmitter 4 is provided on a separate auxiliary printed circuit board 14, which overlies the main circuit board 13 and is spaced therefrom by an air gap. A layer of RADAR absorptive material (RAM) 15 is provided over the main circuit board 13 between the main circuit board 13 and the auxiliary circuit board 14. The electrical connections 16 between the main circuit board and the auxiliary circuit board 14 are minimal. The antenna 17 for the wireless data transmitter 4 is arranged on an antenna circuit board which is substantially perpendicular to the plane of the auxiliary circuit board 14 (and the main circuit board 13).

In order to reduce conducted coupling of RF noise between the wireless data transceiver 4 and the microwave sensor 1, the wireless transceiver 4 is mounted on its own PCB 14 which itself is mounted above the main PCB 13. This separate PCB 14 has its power and signal lines 16 electrically connected through carefully selected ferrites (see FIG. 1) to reduce to the fullest extent the conducted emissions from the wireless data transmitter 4 that perturb the microwave sensor's output.

The auxiliary circuit board 14 also act as a ground plane for the antenna 17. This allows flexibility for the positioning of the wireless transceiver 4 within the device, and in turn for the optimal orientation of the antenna 17 to be selected. The ability to place the antenna 17 in a chosen orientation allows for the microwave sensor 1 to be placed in a null in the gain of the antenna 17, thus reducing the effect of radiated emissions from the wireless data transmitter 4 on the microwave sensor 1.

A further beneficial feature of having a separate PCB 14 for the wireless data transceiver 4 is that there are minimal electrical connections 16 between the two PCBs. This makes mitigating the conducted noise easier while also reducing the component count and overall cost of filtering/suppressing components.

In a practical implementation, objects and material surrounding the device can shape the gain of the antenna 17 leading to radiative coupling between the wireless data transmitter 4 and the microwave sensor 1. The effect of RF emissions is reduced further by placing a thin sheet 15 of RADAR Absorptive Material (RAM) on the back of the main PCB 13, leaving an air gap between the RAM and the auxiliary PCB 14. The RAM 15 is selected to attenuate the fundamental of the carrier frequency used by the wireless data transmitter 4 as opposed to the operating frequency of the microwave sensor 1.

Figure 3:
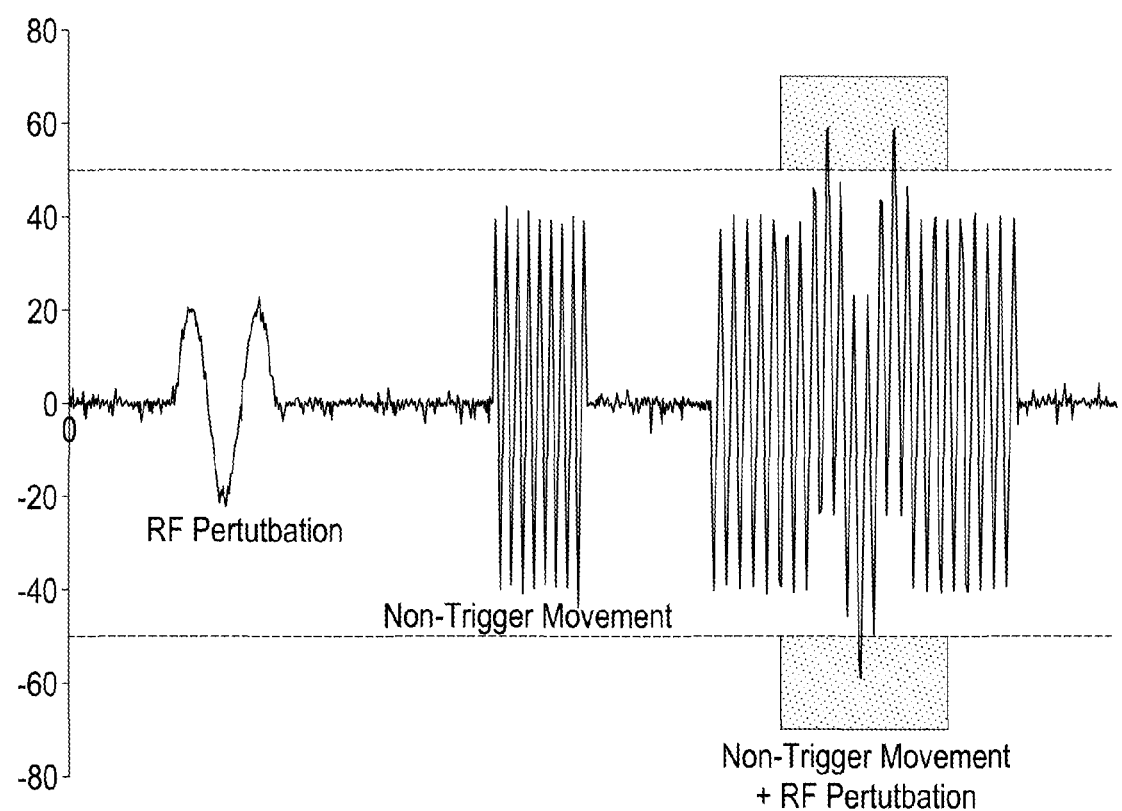
FIG. 3 represents the output signals from the microwave sensor of the sensing device of FIG. 1.

FIG. 3 shows the effect of RF perturbation on the amplified signal received at the microcontroller 3 from the analogue amplifier 2. In FIG. 3, the left-hand waveform represents the output signal from the amplifier 2 due to a data transmission by the wireless data transceiver 4. The middle waveform represents the output signal from the amplifier due to movement in the field of detection of the microwave sensor 1 that is insufficient to be considered to represent the presence of a moving object in the field of detection of the microwave sensor 1 ("non-trigger movement"). In order for the microcontroller 3 to register the presence of a moving object in the field of detection of the microwave sensor 1, the output from the amplifier 2 must exceed the trigger level indicated by the dashed lines in FIG. 3. The right-hand waveform in FIG. 3 shows the effect of RF perturbation due to a data transmission by the wireless data transceiver 4 at the same time a non-trigger movement is detected by the microwave sensor 1. As can be seen from FIG. 3, the combination of the non-trigger movement and the RF perturbation increases the level of the output signal from the amplifier 2 beyond the trigger level, which would cause a false triggering of the sensing device.

If the effects of a moving body in the field of detection of the microwave sensor 1 produce an output voltage V, from the amplifier 2 and the effects of receiving RF noise from the wireless data transceiver produce an output voltage $V_r$, then the voltage that is received by the microcontroller is $V_t = V_v + V_r$ as indicated by the right-hand waveform in FIG. 3. The perturbation caused by RF data transmission is additive to any genuine signal caused by movement, provided that the perturbation is not so large that the amplifier saturates.

However, in the sensing device according to the present invention, the same microcontroller controls the wireless data transmission as carries out the signal processing to determine whether a trigger event has occurred. Consequently, while data transmission is taking place under the control of the microcontroller 3, the trigger level required to register a trigger event can be increased temporarily by an amount corresponding to $V_r$ (indicated by the grey boxes in FIG. 3), in order that the output voltage from the amplifier 2 due to movement in the field of detection of the microwave sensor 1 must exceed the level corresponding to the unincreased trigger level. Alternatively, the microcontroller can deduct a voltage corresponding to $V_r$ from the measured signal $V_t$ to give an adjusted measurement that corresponds to actual reflected signal only. This provides a further method of reducing the effect of both conducted and radiated emissions using signal processing software.

In determining whether a trigger event has occurred, the microcontroller 3 determines an "occupancy score" corresponding to the output voltage from the amplifier 2.

The occupancy score is the outcome from a digital signal processing routine performed by the microcontroller 3 and is linearly proportional to a function of the output signal from the amplifier 2. Thus, the occupancy score shares the additive nature of the signals caused by movement and perturbation due to data transmissions.

In FIG. 3 one can see an example of what one might expect to see from various signal sources. The dashed lines show a nominal trigger threshold ±50. This threshold is passed when the same non-triggering movement from the middle example is mixed with a perturbation from an RF data transmission. However, the perturbation in the left-hand example represents the signal level due to RF data transmission. A peak level of 23 is recorded and so the trigger threshold is adjusted accordingly during the next RF data transmission. The grey boxes represent the temporary increase of the threshold. The suppression is only applied during the RF data transmission, the nominal threshold applying outside of this period. The raised threshold leads to the same difference between the threshold and the peak signal being observed in both the middle and right examples.

The value of $V_r$ is calibrated by the microprocessor 3 at various regular intervals by deliberately transmitting data. The output signals from the amplifier 2 are measured immediately before and after transmission, as well as during the transmission. The calibration process determines the minimum occupancy score before and after the transmission and subtracts the peak occupancy score during the transmission. This gives a minimum suppression level by which the trigger level must be increased to compensate for RF perturbation. Added to this minimum suppression level is a predetermined amount to account for expected variation between calibration events. The resultant value is the suppression level used by the microcontroller 3 to compensate for RF perturbation during data transmission.

The calibration events only take place periodically, yet often enough to track environmental changes such as temperature and humidity variations and the altering of the position and properties of the material in the local vicinity of the sensing device. Once a predetermined "minimum time between calibrations" has elapsed, the microcontroller 3 identifies a period of known non-occupancy. A period of known non-occupancy is defined as a continuous period of time in which the occupancy score remains below a predetermined level (which itself is far below any level that would be considered as a state of occupancy). If the period of known non-occupancy lasts for more than a predetermined length of time the calibration process starts and a deliberate transmission is made; alternatively the next transmission made out of necessity can be used. Once the calibration measurements are made as described above, the microcontroller 3 waits for a further period of time to make sure that the transmission did not coincide with the start of a genuine occupancy. If the period of known non-occupancy extends for a predetermined period of time after the calibration event the new suppression value is accepted and used in future until the next calibration.

The suppression level obtained from a calibration event is used during periods of data transmission (and for a predetermined period afterwards to account for resonance in the amplifier). The threshold for triggering a state of occupancy is raised by the suppression level. During transmissions of data the signal level must exceed this new temporary threshold in order for a state of occupancy to be identified.

This method of suppression allows for detection to continue during transmissions instead of using a brute force method of blanking the detector for these periods. Adaptive suppression is especially useful when a device transmits for prolonged periods of time or regularly; thus avoiding needless lengthy periods of detection blackout.

In summary, a sensing device comprises a microwave sensor 1 configured to emit microwave radiation and to receive microwave radiation reflected by a moving body in the field of the detection of the microwave sensor and a wireless data transmitter 4 configured to transmit data to a remote receiver. A main power supply provides electrical power at a first voltage to the sensing device. A first regulator 6 provided between the main power supply and the microwave sensor 1 provides a sensor power supply to the microwave sensor 1 at a voltage below the voltage of the main power supply. The wireless data transmitter 4 is powered from the main power supply via a transmitter power supply connection arranged in parallel with the first regulator 6. The microwave sensor 1 is provided on a first circuit board and the wireless data transmitter 4 is provided on a second circuit board, with the second circuit board overlying the first circuit board and spaced therefrom. A signal processing device is configured to receive an output signal from the microwave sensor 1 and to generate an occupancy signal indicative of the presence of a moving body in the field of detection of the microwave sensor 1 when the output signal exceeds a threshold level. The signal processing device is configured to increase the threshold level temporarily during data transmission by the wireless data transmitter 4, in order to compensate for RF interference due to the data transmission.

Throughout the description and claims of this specification, the words "comprise" and "contain" and variations of them mean "including but not limited to", and they are not intended to (and do not) exclude other components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The invention claimed is:
1. A sensing device comprising:
a microwave sensor configured to emit microwave radiation and to receive microwave radiation reflected by a moving body in the field of detection of the microwave sensor;

a wireless data transmitter configured to transmit data to a remote receiver, a main power supply for providing electrical power at a first voltage to the sensing device, a first regulator provided between the main power supply and the microwave sensor for providing a sensor power supply to the microwave sensor at a voltage below the voltage of the main power supply, wherein the wireless data transmitter is powered from the main power supply via a transmitter power supply connection arranged in parallel with the first regulator.

2. A sensing device as claimed in claim 1 further comprising a second regulator provided between the main power supply and the wireless data transmitter in parallel with the first regulator for providing a transmitter power supply to the wireless data transmitter at a voltage below the voltage of the main power supply.

3. A sensing device as claimed in claim 1, wherein a first inductor is provided between the transmitter power supply connection and the first regulator.

4. A sensing device as claimed in claim 1, wherein a second inductor is provided in the transmitter power supply connection to the wireless data transmitter.

5. A sensing device as claimed in claim 1, wherein a third inductor is provided in the return path of the sensor power supply.

6. A sensing device as claimed in claim 1, wherein a fourth inductor is provided in the return path of the transmitter power supply in parallel with the return path of the sensor power supply.

7. A sensing device as claimed in claim 1, wherein the voltage of the main power supply is in the range 10V to 18V.

8. A sensing device as claimed in claim 1, wherein the voltage of the sensor power supply is in the range 1 V to 7V.

9. A sensing device as claimed in claim 1, wherein the voltage of the transmitter power supply is in the range 1 V to 7V.

10. A sensing device as claimed in claim 1, wherein the microwave sensor is provided on a first circuit board and the wireless data transmitter is provided on a second circuit board, with the second circuit board overlying the first circuit board and spaced therefrom.

11. A sensing device comprising:
a microwave sensor configured to emit microwave radiation and to receive microwave radiation reflected by a moving body in the field of the detection of the microwave sensor; and
a wireless data transmitter configured to transmit data to a remote receiver, wherein the microwave sensor is provided on a first circuit board and the wireless data transmitter is provided on a second circuit board, with the second circuit board overlying the first circuit board and spaced therefrom.

12. A sensing device as claimed in claim 10, wherein the electrical connections between the first circuit board and the second circuit board comprise one or more inductors for suppressing radio frequency interference of the microwave sensor by the wireless data transmitter.

13. A sensing device as claimed in claim 10, wherein the second circuit board comprises an antenna for the wireless data transmitter and the second circuit board forms a ground plane for the antenna.

14. A sensing device as claimed in claim 10, wherein a layer of radar absorptive material is interposed between the first circuit board and the second circuit board.

15. A sensing device as claimed in claim 1 further comprising a signal processing device configured to receive an output signal from the microwave sensor and to generate an occupancy signal indicative of the presence of a moving body in the field of detection of the microwave sensor when the output signal exceeds a threshold level, wherein the signal processing device is configured to increase the threshold level temporarily during data transmission by the wireless data transmitter, whereby to compensate for RF interference due to the data transmission.

16. A sensing device comprising:
a microwave sensor configured to emit microwave radiation and to receive microwave radiation reflected by a moving body in the field of the detection of the microwave sensor;
a wireless data transmitter configured to transmit data to a remote receiver; and
a signal processing device configured to receive an output signal from the microwave sensor and to generate an occupancy signal indicative of the presence of a moving body in the field of detection of the microwave sensor when the output signal exceeds a threshold level,
wherein the signal processing device is configured to increase the threshold level temporarily during data transmission by the wireless data transmitter, whereby to compensate for RF interference due to the data transmission.

17. A method of calibrating a sensing device as claimed in claim 15, the method comprising:
determining that the output signal from the microwave sensor has been at a low level indicative of the absence of a moving body in the field of detection of the microwave sensor for a period of time;
transmitting data using the wireless data transmitter;
during data transmission measuring the output signal from the microwave sensor; determining on the basis of the measured output signal an amount by which the threshold level shall be increased temporarily during data transmission to compensate for RF interference due to the data transmission.

18. The method of claim 17 comprising the subsequent steps of:
waiting for a predetermined period of time and repeating the method of claim 17; comparing the first threshold increase amount determined to the second threshold increase amount determined, whereby to confirm that the determined threshold amounts are representative of RF interference due to the data transmission.

19. The method of claim 17 comprising the subsequent step of:
determining that the output signal from the microwave sensor has continued for a period of time at a low level indicative of the absence of a moving body in the field of detection of the microwave sensor.

20. A sensing device as claimed in claim 15 comprising a data processing device configured to control calibration of the sensing device by causing the sensing device to
determine that the output signal from the microwave sensor has been at a low level indicative of the absence of a moving body in the field of detection of the microwave sensor for period of time;
transmit data using the wireless data transmitter;
measure during data transmission the output signal from the microwave sensor; and
determine on the basis of the measured output signal an amount by which the threshold level shall be increased temporarily during data transmission to compensate for RF interference due to the data transmission.

21. A sensing device as claimed in claim 20, wherein the signal processing device is provided by the data processing device.

\* \* \* \* \*